United States Patent [19]
Jung

[11] Patent Number: 6,043,132
[45] Date of Patent: Mar. 28, 2000

[54] METHOD FOR FORMING HSG SILICON FILM OF SEMICONDUCTOR DEVICE

[75] Inventor: Woo-young Jung, Suwon, Rep. of Korea

[73] Assignee: Samsung Electronics Co., Ltd., Suwon, Rep. of Korea

[21] Appl. No.: 09/161,065

[22] Filed: Sep. 25, 1998

[30] Foreign Application Priority Data

Sep. 26, 1997 [KR] Rep. of Korea ............. 97-49093

[51] Int. Cl.[7] ............................................. H01L 21/20
[52] U.S. Cl. ..................... 438/398; 438/255; 438/725
[58] Field of Search ............................. 438/396, 398, 438/253, 255, 725, 706

[56] References Cited

U.S. PATENT DOCUMENTS

| 5,851,877 | 12/1998 | Ho et al. ............................ | 438/253 |
| 5,874,336 | 2/1999 | Cherng .............................. | 438/255 |
| 5,930,625 | 7/1999 | Lin et al. ........................... | 438/253 |
| 5,968,374 | 10/1999 | Bullock ............................. | 216/16 |

OTHER PUBLICATIONS

Kudoh, et al: "Directional Plasma CVD Technology for Sub–Quarter Micrometer Feature Size Multilevel Interconnection", Extended Abstracts of the 1997 International Conference on Solid State Devices and Materials, Hemamatsu, 1997, pp. 290–291.

Adalsteinsson, et al: "High Density Plasma Deposition Modeling Using Level Set Methods", DUMIC Conference, 1996, pp. 116–123.

Primary Examiner—Tuan H. Nguyen
Attorney, Agent, or Firm—Skjerven, Morrill, MacPherson, Franklin & Friel LLP; David T. Millers

[57] ABSTRACT

Methods of forming a uniform HSG silicon film on a conductive layer pattern use $C_xF_y$ and HF to remove the polymer by-products resulted etching, ashing and stripping steps. This effective removal promotes the formation of uniform HSG silicon film the conductive layer pattern. Accordingly, when the conductive layer pattern is used as the storage node of a capacitor, the capacitance of the capacitor increases, and the difference in the capacitance between capacitors minimizes, resulting in stabilized operation characteristics of the semiconductor device.

16 Claims, 3 Drawing Sheets

METHOD FOR FORMING HSG SILICON FILM OF SEMICONDUCTOR DEVICE

BACKGROUND OF THE INVENTION

1. Field of the Invention

The present invention relates to a method of manufacturing a semiconductor device, and more particularly, to a method of forming a hemi-spherical grained (HSG) silicon film.

2. Description of the Related Art

Increasing the surface area of capacitor electrodes, narrowing the distance between the electrodes, and using a dielectric with a higher dielectric constant increase the capacitance of a capacitor.

A horizontal method and a vertical method are used for increasing the surface area of a capacitor electrode. Between the two methods, horizontal increase of the surface area of an electrode is less desirable because this method limits high integration of semiconductor devices. In contrast, the vertical method, which forms the electrode three-dimensionally, reduces horizontal surface area of the electrode and increases vertical surface area of the electrode. A stack type electrode, a fin type electrode, and a cylindrical type electrode are representative three-dimensional electrodes.

In other words, the vertical method has an advantage in that the surface area of the electrode increases without limiting integration of semiconductor devices. However, the vertical method causes a problem in planarization due to a large step height difference between the area containing the electrode and the surrounding area.

Forming a HSG silicon film on the electrode can solve above planarization problem. A conventional method of forming an HSG silicon film on the surface of the electrode increases the surface area of the electrode, maintaining the height of the electrode of a capacitor at an appropriate level.

Hereinafter, the conventional method of forming the HSG silicon film of the semiconductor device is described with reference to the attached drawings.

Referring to FIG. 1, an etch stopper layer 12 is formed on the entire surface of a semiconductor substrate 10, and a polysilicon layer 14 is formed on the entire surface of etch stopper layer 12. Then, a patterned photosensitive layer 16 for masking an area of polysilicon layer 14 is formed on polysilicon layer 14. Polysilicon layer 14 is anisotropically etched using patterned photosensitive layer 16 as an etching mask. Anisotropic etching continues until etch stopper layer 12 under polysilicon layer 14 is exposed. After removal of patterned photosensitive film 16, as shown in FIG. 2, a polysilicon layer pattern 14a remains on etch stopper layer 12. Polysilicon layer pattern 14a is used as a storage node. A polymer layer (not shown) forms as a by-product of the anisotropic etching of polysilicon layer 14. This polymer layer can be removed by a hydrogen fluoride (HF) treatment before the removal of patterned photosensitive layer 16.

The process of removing patterned photosensitive layer 16 can be divided into an ashing step and a stripping step. The ashing step burns patterned photosensitive layer 16 using plasma, and the stripping step removes the ashes. In the ashing, a reaction between plasma and patterned photosensitive layer 16 produces a polymer layer 18 on the side wall of patterned polysilicon layer 14a.

After the stripping step, source gases such as $SiH_4$ and $Si_2H_6$ form HSG seeds on the entire surface of patterned polysilicon layer 14a. Then, the HSG seeds are grown by heating the semiconductor substrate, on which the HSG seeds are formed, and produce, as shown in FIG. 3, an HSG silicon layer 20 on patterned polysilicon layer 14a.

However, polymer layer 18 can prevent a uniform formation of the HSG seeds on patterned polysilicon layer pattern 14a. As a result, HSG silicon layer 20 lacks uniformity, as shown in FIG. 3. Namely, the morphology of HSG film 20 on patterned polysilicon layer 14a can be significantly different from the morphology of HSG film 20 on another patterned polysilicon layer 14a, and thereby, each storage node can have a different electrostatic capacity. In addition, there is a chance that a portion of patterned polysilicon layer pattern 14a is not covered with HSG film 20.

SUMMARY OF THE INVENTION

The present invention provides methods for uniform formation of HSG silicon film on the entire surface of a conductive layer pattern which is used as an electrode of a capacitor in a semiconductor device. This uniform formation maximizes capacitance of the capacitor and minimizes the difference in capacitances of capacitors.

A method of forming an HSG silicon film according to the present invention includes a formation of a conductive layer on a semiconductor substrate, and a subsequent formation of a patterned photosensitive film on the conductive layer. Then, etching of the conductive layer with a source gas including $C_xF_y$ patterns the conductive layer. After the etching, the photosensitive film pattern, which was used as a mask in the etching, is removed by using an oxygen gas including $C_xF_y$. Next, a HSG silicon film is formed on the patterned conductive layer.

In the step of removing the photosensitive film pattern, after ashing the photosensitive layer pattern, $C_xF_y$, such as $CF_4$, $C_2F_6$, or $C_4F_8$, is mixed with $O_2$ in a ratio of 1:5. After ashing and stripping the photosensitive layer pattern, a wet etching by $C_xF_y$ cleans the patterned conductive layer. During this cleaning, the temperature of the semiconductor substrate is not less than 200° C.

The present invention provides another method for forming a uniform HSG silicon film of a semiconductor device.

A first insulating layer and a conductive layer are sequentially formed on a semiconductor substrate. A patterned photosensitive layer is formed on the conductive layer. Then, etching of the conductive layer with a source gas including $C_xF_y$ patterns the conductive layer using the patterned photosensitive layer as an etching mask. After the etching, a surface treatment with $C_xF_y$ cleans the patterned conductive layer and is followed by ashing and stripping of the patterned photosensitive layer. Then, a HSG silicon film is formed on the patterned conductive layer.

The surface treatment with $C_xF_y$ removes the polymer, which resulted from the etching process, on the surface of the patterned photosensitive layer and the side walls of patterned conductive layer. Here, $C_xF_y$ is mixed with $O_2$ in a ratio of 1:5, and the semiconductor substrate is maintained to be not less than 200° C.

The present invention provides yet another method for forming a uniform HSG silicon film of a semiconductor device.

A first insulating film and a conductive layer are sequentially formed on a semiconductor substrate. A patterned photosensitive layer is formed on the conductive layer. Then, etching of the conductive layer with a source gas including $C_xF_y$ patterns the conductive layer using the patterned photosensitive layer as an etching mask. The polymer resulted from the etching is removed by a process with HF before ashing and stripping of the patterned photosensitive layer. This HF process is performed after the ashing and stripping but before a HSG silicon film is formed on the patterned conductive layer.

In the present invention, a treatment of the semiconductor substrate with a source gas including $C_xF_y$ and/or a HF gas before formation of HSG film removes or prevents formation of the polymers resulted from etching, ashing and stripping and thereby, promotes a uniform formation of the HSG silicon film. The uniform HSG film on a storage node of a capacitor improves the stability and reliability in the operation of the semiconductor device by minimizing the difference in the capacitance between capacitors.

BRIEF DESCRIPTION OF THE DRAWINGS

The present invention will become more apparent by describing in detail embodiments thereof with reference to the attached drawings in which.

DESCRIPTION OF THE PREFERRED EMBODIMENTS

Hereinafter, methods for forming a uniform HSG (Hemi-Spherical Grained) silicon film of a semiconductor device according to the present invention will be described with reference to the attached drawings.

Figure 1:
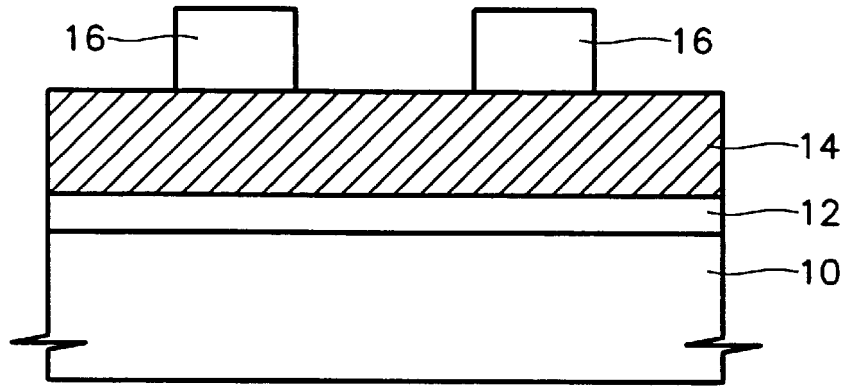
FIGS. 1 through 3 are sectional views showing steps of a method of forming an HSG silicon film of a semiconductor device according to a conventional technology.
Figure 2:
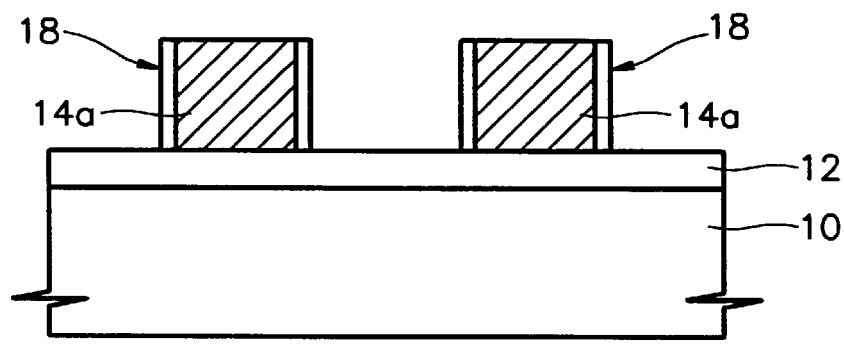
Figure 3:
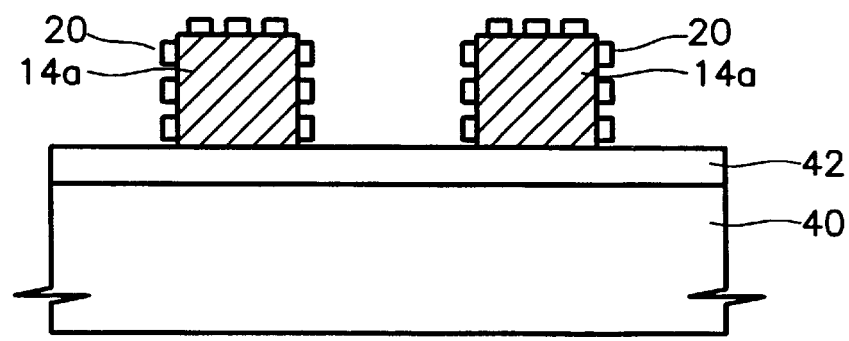
Figure 4:
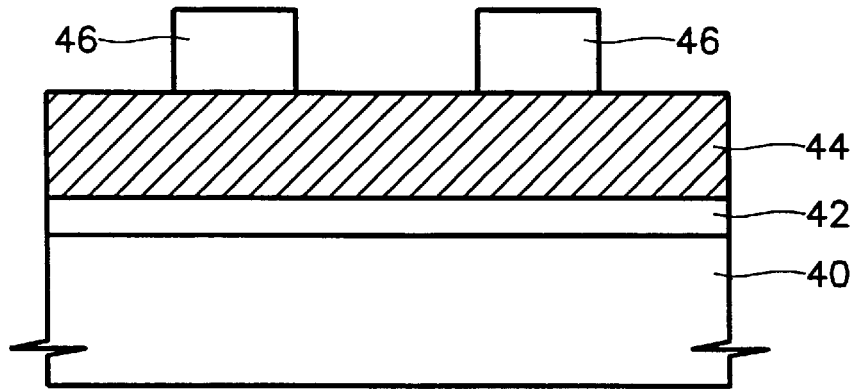
FIGS. 4 through 6 are sectional views showing steps of a method of forming an HSG silicon film of a semiconductor device according to an embodiment of the present invention.

Referring to FIG. 4, a first insulating film 42, such as silicon dioxide or silicon nitride, forms on a semiconductor substrate 40. First insulating film 42 acts as an etch stop layer in later etching process. Though not shown, an interlayer dielectric film can form between semiconductor substrate 40 and first insulating film 42. A conductive layer 44, for example, a doped polysilicon layer is formed on first insulating film 42. Conductive layer 44 connects to semiconductor substrate 40 through a conductive plug layer (not shown). When conductive layer 44 is used as a storage node of a capacitor, the thickness of conductive layer 44 affects the surface area of the storage node. Namely, the thicker conductive layer 44 is, the larger the surface area of the storage node is. Therefore, a thick conductive layer 44 is preferable for a large capacitance capacitor. However, a thick conductive layer 44 can cause a planarization problem in later processes of semiconductor fabrication due to a large step height difference between the capacitor area and the adjacent areas. For patterning conductive layer 44, a photosensitive layer (not shown) is coated on the entire surface of conductive layer 44, and a patterning process forms a patterned photosensitive layer 46. A part of the conductive layer 44 masked by patterned photosensitive layer 46 is the storage node.

Figure 5:
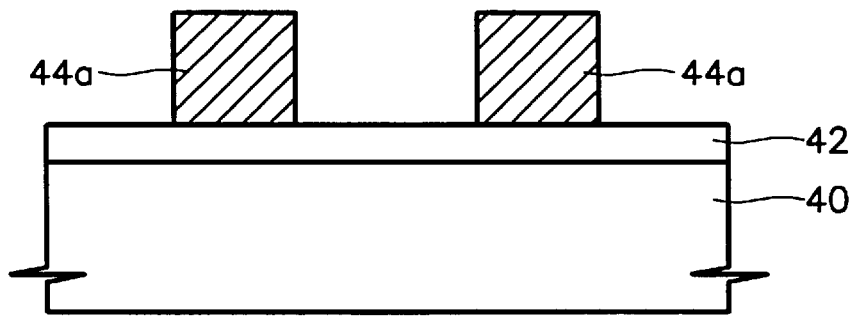

Anisotropic etching of conductive layer 44 using photosensitive layer pattern 46 as etching mask results in a patterned conductive layer 44a (FIG. 5). Patterned conductive layer 44a includes the storage node of the capacitor. A gas in which $Cl_2$, HBr, and $C_xF_y$ are mixed is used as a source gas in the anisotropic etching. This anisotropic etching can be achieved by a reactive ion etching using a high density plasma. A preferred gas mixture ratio of $Cl_2$, HBr, and $C_xF_y$ is 4:5:1, and a preferred power during etching is 300 W. HBr maintains the profile of conductive layer pattern 44a to be vertical during the anisotropic etching. $C_xF_y$ such as $CF_4$, $C_2F_6$ or $C_4F_8$, prevents polymer formation on the surface of patterned conductive layer 44a during the anisotropic etching. Some of the $C_xF_y$'s are effective above a certain temperature level. An exemplary temperature is 200° C. at which patterned photosensitive layer 46 burns. After anisotropic etching of conductive layer 44, patterned photosensitive layer 46 is ashed and stripped. During ashing and stripping, keeping the temperature of semiconductor substrate 40 at 200° C. or more is preferable.

The ashing of photosensitive layer pattern 46 using plasma produces polymer by-product from the reaction between the photosensitive layer and the plasma. The polymer covers the surface of patterned conductive layer 44a. Therefore, after ashing patterned photosensitive layer 46, a surface treatment using a gas in which $C_xF_y$ and $O_2$ are mixed in a ratio, for example, 1:5, removes the polymer. The surface treatment may continue for 5 to 20 seconds at a pressure of 1 to 100 torr. Also, the surface of patterned conductive layer 44a may be contaminated in the stripping step. In order to prevent this, a wet-processing using $C_xF_y$ cleans conductive layer pattern 44a after the stripping step. In short, the treatments using $C_xF_y$ remove the polymers resulting from conductive layer patterning as well as from removing patterned photosensitive layer 46. As a result, as shown in FIG. 5, a patterned conductive layer 44a having a clean surface forms on first insulating film 42.

Figure 6:
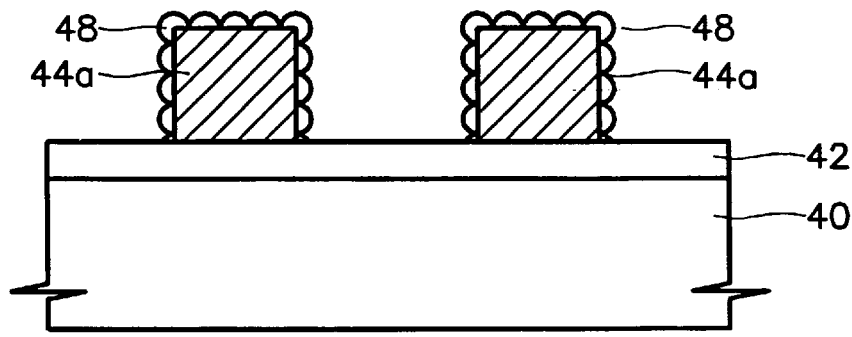

Then, HSG seeds (not shown) are uniformly formed on patterned conductive layer pattern 44a by a source gas such as $SiH_4$ or $Si_2H_6$ because the polymer by-product was removed from the entire surface of patterned conductive layer 44a. Heating of the HSG seed to an elevated temperature results in growth of the HSG seed to form a uniform HSG silicon film 48 on the entire surface of patterned conductive layer 44a, as shown in FIG. 6. For example, heating at 580 to 600° C. for 10 minutes may achieve a uniform HSG silicon film 48. As a result, the surface area difference between HSGs formed on patterned conductive layer 44a is negligible. Therefore, the surface areas of the HSGs formed on patterned conductive layer 44a are the same.

The present invention provides various processes for forming a uniform HSG silicon film. These processes are variations based on the process described above.

In particular, HF gas can be used instead of $C_xF_y$ in order to prevent the polymer from forming on the surface of patterned conductive layer 44a in ashing and stripping of patterned photosensitive layer 46.

Also, the polymer from conductor layer patterning can be removed differently. The conductive layer can be etched by a gas in which $Cl_2$ gas and HBr gas are mixed without $C_xF_y$. To remove the polymer formed on the side of patterned conductive layer 44a and on the entire surface of patterned photosensitive layer 46, a surface treatment using a gas including $C_xF_y$ or HF gas is performed before removing patterned photosensitive layer 46. Instead of using the gas, baking of the semiconductor substrate after the etching at 200° C. can remove the polymer.

Cleaning of patterned conductive layer 44a after stripping can be performed using a gas including $C_xF_y$. During this process, the temperature of the semiconductor substrate is maintained at about 200° C.

After anisotropically etching the conductive layer (44 of FIG. 4), forming the patterned conductive layer 44a, and baking patterned photosensitive layer 46, which remains on conductive layer 44a, at an elevated temperature, for example, 200° C., patterned photosensitive layer pattern 46 is ashed and stripped. By doing so, it is possible to form a uniform HSG silicon film by preventing the polymer from being attached to the surface of patterned conductive layer 44a.

The present invention can combine the variations mentioned above in many ways. For example, conductive layer 44 can be etched using the gas in which $Cl_2$ gas and HBr gas are mixed as source gas. The polymer covering the side surface of patterned conductive layer 44a and the entire surface of patterned photosensitive layer 46 can be removed by HF gas treatment. Then, conductive layer pattern is cleaned by surface treatments using $C_xF_y$ during and after ashing and stripping of patterned photosensitive layer 46.

Figure 7:
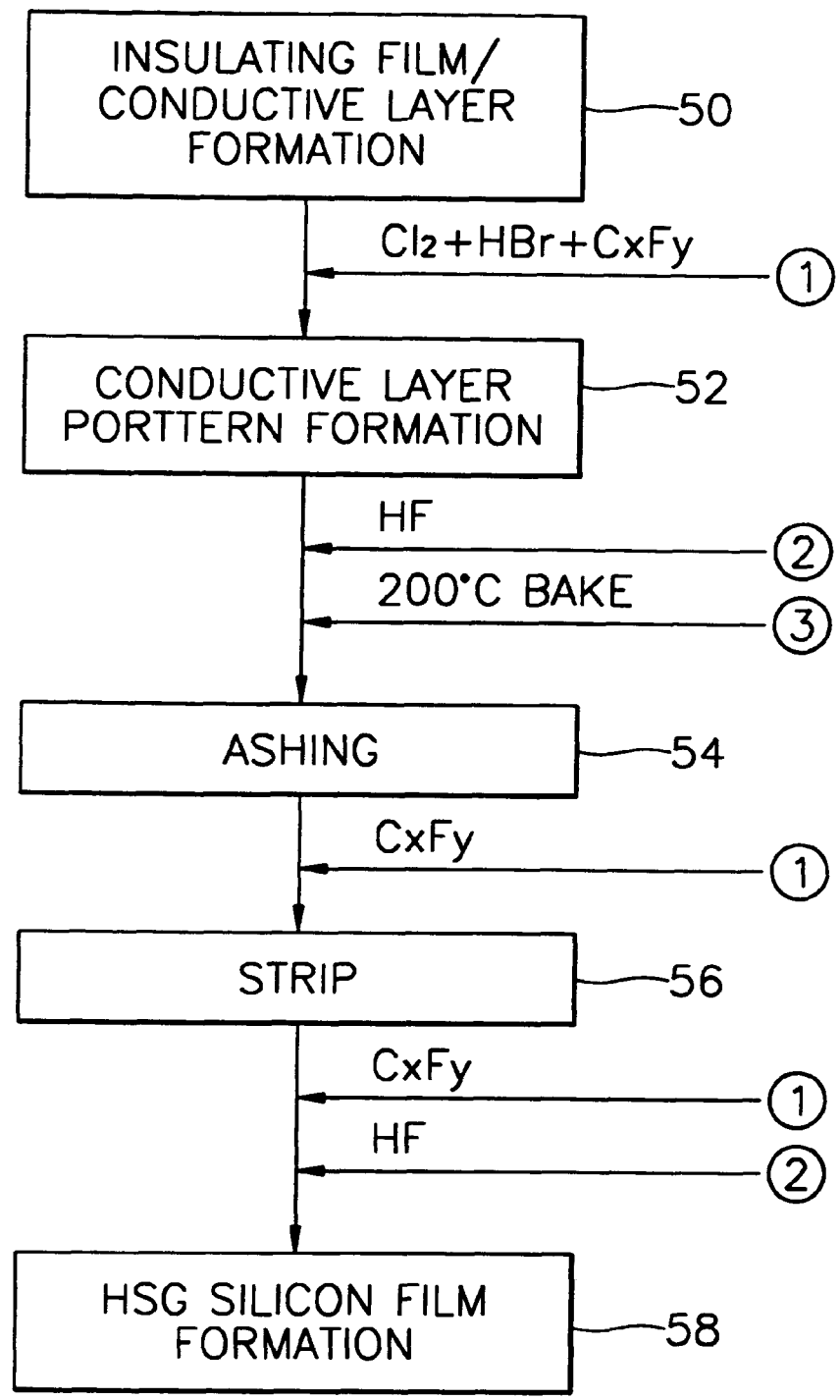
FIG. 7 is a block diagram showing methods of forming an HSG silicon film of a semiconductor device according to the present invention.

FIG. 7 illustrates a variety of processes in accordance with the present invention. In FIG. 7, first through fifth blocks 50, 52, 54, 56, and 58 respectively denote the steps of sequentially forming an insulating film and a conductive layer on a semiconductor substrate, forming a patterned conductive layer by patterning the conductive layer, ashing and stripping the patterned photosensitive layer used for forming the patterned conductive layer, and of forming HSG silicon film. Also, in FIG. 7, the circled numbers denote optional steps of the present invention, which were mentioned above. That is, circled 1 is an etching of a conductive patterned layer using a gas mixture of $Cl_2$, HBr, and $C_xF_y$. Circled 2, 3 and 4 is a surface treatment of the conductive patterned layer where the surface treatment uses HF gas, bakes the wafer at 200° C., and uses $C_xF_y$ gas, respectively. Circled 1' is a surface treatment of the wafer using $C_xF_y$ after ashing. Circled 1' and 2' are a surface treatment of the wafer using $C_xF_y$ and HF, respectively, after stripping. A process can include steps represented by circled number from each set of numbers, {1, 2, 3, 4}, {1'} and {1,", 2"}. For example, a combination of a process including steps 1, 1' and 2" can produce a clean conductive layer pattern for uniform HSG film formation. Other combinations, such as 2-1'-1", 3-1'-2', etc., also produce a clean conductive layer pattern. That is, any combination of numbers, each of which came from a different set works.

As shown above, the present invention provides various methods for forming uniform HSG silicon film on a conductive layer pattern. When the conductive layer pattern is used as storage node of a capacitor, the present invention increases the capacitance of the capacitor, minimizes the difference of the capacitance between capacitors, and thus stabilizes the operation characteristics of a semiconductor device.

The present invention is not restricted to the above embodiments, and it is clearly understood that many variations are possible within the scope and spirit of the present invention by anyone skilled in the art.

What is claimed is:

1. A method of forming an HSG silicon film of a semiconductor device, comprising:
    (a) forming a conductive layer on a semiconductor substrate;
    (b) forming a patterned photosensitive layer on the conductive layer;
    (c) etching the conductive layer to form a patterned conductive layer using the patterned photosensitive layer as an etching mask and using a source gas including $C_xF_y$;
    (d) ashing and stripping the patterned photosensitive layer using a gas including $C_xF_y$; and
    (e) forming an HSG silicon film on the entire surface of the patterned conductive layer.

2. The method of claim 1, wherein $C_xF_y$ is $CF_4$, $C_2F_6$, or $C_4F_8$.

3. The method of claim 1, wherein a surface treatment of the patterned photosensitive layer and the patterned conductive layer is performed using a gas in which $C_xF_y$ and $O_2$ are mixed at a ratio of 1:5 before ashing and stripping the patterned photosensitive layer.

4. The method of claim 1, wherein, after ashing the patterned photosensitive layer in the step (d), the patterned conductive layer is processed using $C_xF_y$.

5. The method of claim 1, wherein, after ashing the patterned photosensitive layer, a gas in which $C_xF_y$ and $O_2$ are mixed in a ratio of 1:5 ratio is used for surface-treatment of the patterned conductive layer.

6. The method of claim 1, wherein, after ashing and stripping the patterned photosensitive layer, the patterned conductive layer is wet processed by $C_xF_y$ and the temperature of the semiconductor substrate is maintained at a temperature of 200° C. or higher.

7. The method of claim 1, wherein, after ashing and stripping the patterned photosensitive layer, the patterned conductive layer is processed using HF and the temperature of the semiconductor substrate is maintained at a temperature of 200° C. or higher.

8. A method of forming an HSG film of a semiconductor device, comprising:
    (a) sequentially forming a first insulating film and a conductive layer on a semiconductor substrate;
    (b) forming a photosensitive layer pattern on the conductive layer;
    (c) patterning the conductive layer to form a patterned conductive layer using the photosensitive layer pattern as an etching mask and using a source gas;
    (d) processing the surface of the patterned conductive layer using $C_xF_y$;
    (e) ashing and stripping the photosensitive layer pattern and processing the patterned conductive layer using an HF gas; and
    (f) forming an HSG silicon film on the patterned conductive layer.

9. The method of claim 8, wherein in step (d), $C_xF_y$ is used as a gas in which $C_xF_y$ and $O_2$ are mixed in a ratio of 1:5, and the semiconductor substrate is maintained at a temperature of 200° C. or higher.

10. The method of claim 8, wherein $C_xF_y$ is $CF_4$, $C_2F_6$, or $C_4F_8$.

11. The method of claim 8, wherein, after ashing the patterned photosensitive layer in the step (f), the patterned conductive layer is processed using a gas in which $C_xF_y$ and $O_2$ are mixed in a ratio of 1:5 before stripping the patterned photosensitive layer and the semiconductor substrate is maintained at a temperature of 200° C. or higher.

12. A method of forming an HSG film of a semiconductor device, comprising:
    (a) sequentially forming a first insulating film and a conductive layer on a semiconductor substrate;
    (b) forming a photosensitive layer pattern on the conductive layer;
    (c) patterning the conductive layer to form a patterned conductive layer using the photosensitive layer pattern as an etching mask and using a source gas;

(d) baking the semiconductor substrate;

(e) ashing and stripping the photosensitive layer pattern and processing the patterned conductive layer using an HF gas; and (f) forming an HSG silicon film on the patterned conductive layer.

13. A method in claim 12, wherein in step (d), the baking temperature is 200° C.

14. A method of forming an HSG silicon film, comprising:

(a) sequentially forming a first insulating film and a conductive layer on a semiconductor substrate;

(b) forming a patterned photosensitive layer on the conductive layer;

(c) patterning the conductive layer to form a patterned conductive layer using the patterned photosensitive layer as an etching mask;

(d) processing the patterned conductive layer and the patterned photosensitive layer using HF;

(e) ashing and stripping the patterned photosensitive layer;

(f) processing the patterned conductive pattern using HF; and (g) forming an HSG silicon film on the patterned conductive layer.

15. The method of claim 14, wherein $C_xF_y$ is used in the step (e) with the temperature of the semiconductor substrate being maintained at a temperature of about 200° C.

16. The method of claim 15, wherein $C_xF_y$ is $CF_4$, $C_2F_6$, or $C_4F_8$.

* * * * *